United States Patent [19]

Whitlow et al.

[11] Patent Number: 5,017,553
[45] Date of Patent: May 21, 1991

[54] HIGH TEMPERATURE SUPERCONDUCTOR HAVING A HIGH STRENGTH THERMALLY MATCHED HIGH TEMPERATURE SHEATH

[75] Inventors: Graham A. Whitlow, Murrysville; Natraj C. Iyer, Monroeville, both of Pa.

[73] Assignee: Westinghouse Electric Corp., Pittsburgh, Pa.

[21] Appl. No.: 469,976

[22] Filed: Jan. 25, 1990

[51] Int. Cl.⁵ .............................................. H01B 12/00
[52] U.S. Cl. ....................................... 505/1; 505/740; 428/555
[58] Field of Search ..................... 505/740, 1; 428/555

[56] References Cited

U.S. PATENT DOCUMENTS

| | | |
|---|---|---|
| 4,863,804 | 9/1989 | Whitlow et al. ............... 428/555 |
| 4,866,032 | 9/1989 | Fujimori et al. ............... 505/1 |
| 4,906,609 | 3/1990 | Yamauchi et al. ............. 505/1 |
| 4,957,901 | 9/1990 | Jacobson et al. .............. 505/1 |

Primary Examiner—Stephen J. Lechert, Jr.
Assistant Examiner—Nina Bhat
Attorney, Agent, or Firm—Daniel P. Cillo

[57] ABSTRACT

A superconductor is made, having a core (10) of superconducting material, enclosed by a contacting metallic sheath (12), where the sheath (12) contains a layer of Ag-Pd alloy with interdispersed, discrete particles of a metal selected from the group consisting of W, Mo, Ni and their mixtures.

15 Claims, 1 Drawing Sheet

HIGH TEMPERATURE SUPERCONDUCTOR HAVING A HIGH STRENGTH THERMALLY MATCHED HIGH TEMPERATURE SHEATH

BACKGROUND OF THE INVENTION

This invention relates to sheathing materials for alkaline earth metal-copper oxide based ceramic superconducting materials, such as $YBa_2Cu_3O_{7-x}$, where the sheathing contains an alloy layer having dispersed particles and has high strength and high temperature characteristics as well as thermal expansion properties compatible with the superconducting materials.

Perovskite related ceramic oxides, comprising alkaline earth metal-copper oxide, such as orthorhombic yttrium-barium-copper oxide materials, usually characterized as $YBa_2Cu_3O_{7-x}$, or "1:2:3 ceramic oxides", are well-known "high temperature" superconductor materials. This 1:2:3 ceramic oxide material has been found to provide electrical superconductivity, that is, essentially no electrical resistance, at temperatures less than or in the region of 93° K.

The 1:2:3 ceramic oxides and other rare earth metal-alkaline earth metal-copper oxide based ceramics can operate in the superconducting mode near the 77° K. boiling point of relatively inexpensive and plentiful liquid nitrogen, and could find increased use in composite windings for high current magnets, energy storage coils, long distance power transmission, and the like. However, 1:2:3 ceramic oxides and other superconducting ceramic oxides, generally made from sintered component oxide particles, are hard and brittle, and are not easily fabricated into fine wire or windings.

This brittleness was recognized by Jin et al., in *Applied Physics Letters*, «High $T_c$ Superconductors-Composite Wire Fabrication", Vol, 51, No. 3, July 20, 1987, pp. 203-204. Jin et al. also recognized the problem of oxygen loss from the metal clad 1:2:3 ceramic oxide. As a solution to these problems, Jin et al. placed a metal cladding around a heat treated 1:2:3 ceramic oxide powder superconducting core. The metal cladding, which was Ag, or Cu with a Ni/Au oxygen diffusion barrier, allowed ease of drawing into fine wire form, from 0.6 cm to 0.02 cm diameter, and also provided an alternate electrical conduction path in case the ceramic oxide lost its superconducting properties, that is, became normal or resistive. Ag was found particularly advantageous as a cladding. The drawn wires were annealed to 900° C. in oxygen. Multifilamentary ribbon composites were also formed.

Fabrication of Ag sheather, 1:2:3 ceramic oxide superconductors such as wires and tapes has been achieved, but in order to attain or restore optimum superconducting properties, it has been found essential to perform final high temperature annealing in oxygen to optimize the core stoichiometry. This post processing heat treatment is limited in maximum temperature by the 960° C. melting point of silver. Thus, post processing heat treatment typically takes place at around 900° C., instead of much closer to the approximate 1,040° C. melting point of the 1:2:3 ceramic oxide.

Use of other higher melting point metals is limited by their poor oxygen diffusivity characteristics. This limitation in maximum heat treatment temperature results in less than optimum sintered densities in the core. Also, the differential thermal expansion between the silver sheath, $19.7 \times 10^{-6}/°C.$, and the 1:2:3 ceramic oxide core, $14 \times 10^{-6}/°C.$, may cause the silver sheath to expand away from the core during heat treatment. This can result in interruption of the electrical connectivity. Finally, the silver sheath, which will be subjected to substantial mechanical strain during drawing into thin wire and other fabrication steps, doesn't possess high strength characteristics.

In an attempt to provide high strength sheathing for superconducting core material, in order to alleviate distortion of sheathed superconducting filaments, U.S. Pat. No. 4,863,804 (Whitlow et al.) taught composite sheathing, where a copper or aluminum inner layer was dispersion hardened with from 0.01 weight % to 1 weight % of $Al_2O_3$, $ZrO_2$, $SiO_2$, $TiO$, $Y_2O_3$, $Cr_2O_3$, $Th_2O_3$, SiC or BC. Alloys, such as Cu-Nb, Cu-Ta, or Al-Fe were also taught as effective. The highly ductile outer layer could be high conductivity copper or aluminum.

Flükiger et al., in *Physica-C*, "Metallurgy and Critical Currents in $YBa_2Cu_3O_7$ Wires", 153–155, 1988, pp. 1574–1579, also recognized deformation problems with fine superconducting wire resulting in a decrease of critical temperature, $T_c$, properties, and the low annealing temperatures dictated by Ag sheathing. Their solution was a sheath containing Ag with up to 5 atom % Pd.

Similarly, Flükiger, in International (German) Patent Application WO 89/02656, filed on Sep. 2, 1988, taught that with an increasing degree of deformation of sheathed $YBa_2Cu_3O_7$ superconducting wire, the critical current density, $J_c$, decreased, and that with heavy deformation, superconducting properties could disappear. In an effort to provide a sheath material capable of being heat treated at temperatures within the range of 940° C. to 1,030° C., wherein $T_c$ values could be significantly increased after superconducting wire deformations, Flükiger taught alloying Ag with: up to 35 weight % Au, up to 31 weight % Mn, up to 20 weight % Pd, up to 35 weight % Pt, or up to 3 weight % Ti. These alloys provided melting points of from 1,000° C. to 1,070° C. Values of $J_c=450A/cm^2$ for 1:2:3 ceramic oxides in a sheath of 92 weight % Ag-8 weight % Pd annealed at 970° C.; and values of $J_c=680 A/cm^2$ for 1:2:3 ceramic oxides in a sheath of 80 weight % Ag-20 weight % Pd annealed at 990° C. were reported. These values are improved over the published value of $J_c=175A/cm^2$ for a 100% Ag sheath for 1:2:3 ceramic oxides, recovery annealed at 900° C.

None of these superconductor sheaths, however, provide superior high strength and high temperature characteristics, as well as thermal expansion properties compatible with the superconducting materials. It is one of the main objects of this invention to provide such sheaths and superconducting wire.

SUMMARY OF THE INVENTION

Accordingly, the invention resides in a superconductor having a core comprising alkaline earth metal-copper oxide based material having superconductivity capability, enclosed by a contacting metallic sheath, characterized in that the sheath contains a layer of Ag-Pd alloy, containing interdispersed, discrete particles of a metal selected from the group consisting of W, Mo, Ni, and mixtures thereof. The discrete W, Mo, or Ni particles are essential to this invention, and preferably, have diameters within the range of 0.05 micrometer to 75 micrometers, and constitute from 5 weight % to 45 weight % of the total alloy-particle weight. The alloy preferably contains from 10 weight % to 50 weight % Pd. The preferred core is YBa$_2$Cu$_3$O$_{7-x}$, although the term "comprising alkaline earth metal-copper oxide based material having superconducting capability" is herein defined to mean: yttrium-alkaline earth metal-copper oxide, rare earth metal-alkaline earth metal-copper oxide, bismuth-alkaline earth metal-copper oxide or, thallium-alkaline earth metal-copper oxide, and mixtures thereof. The term "rare earth" as used herein means elements 57 to 71, with La, Ho, Er, Yb, and mixtures thereof preferred. The amount of W, Mo, or Ni particles used in the sheath will be determined by the expansion coefficient of the particular core in question.

The invention also resides in a superconductor having a core comprising alkaline earth metal-copper oxide based material having superconductivity capability, enclosed by a contacting metallic sheath having at least an inner and outer wall, characterized in that one of the walls comprises a Ag-Pd alloy, containing interdispersed, discrete particles of a metal selected from the group consisting of W, Mo, Ni, and mixtures thereof, and at least one other wall is made of Ag. The superconductors of this invention can be single wires of round or other configuration, a flat foil wire, or a plurality of filaments bundled together into a cable.

The addition of Pd to help eliminate thermal mismatch, and at least one of W, Mo, and Ni as a dispersoid in the Ag-Pd alloy matrix to help improve sheath strength without adversely affecting electrical properties, provides a superior conductor which is ductile, heat treatable at high temperatures and electrically connective.

BRIEF DESCRIPTION OF THE DRAWINGS

In order that the invention will be more readily understood, the following description of the preferred embodiments will now be described, by way of example only, with reference to the accompanying drawings in which.

DESCRIPTION OF THE PREFERRED EMBODIMENTS

The ceramic oxide particles which are useful as a core for the sheaths of the invention are selected from the group consisting of yttrium containing, alkaline earth metal-copper oxides, such as YBa$_2$Cu$_3$O$_{7-x}$; and rare earth containing, alkaline earth metal-copper oxides, such as LaBa$_2$CU$_3$O$_{7-x}$ ceramics where the preferred rare earth elements are La, Ho, Er, and Yb; as well as bismuth containing, alkaline earth metal-copper oxides, such as Bi$_x$(Ba or Sr)$_2$ CA$_{n-1}$Cu$_n$O$_z$ ceramics; and thallium containing, alkaline earth metal-copper oxides, such as Tl$_x$(Ba or Sr)$_2$ CA$_{n-1}$Cu$_n$O$_z$ ceramics, where $Z=(3/2)x+2n+2-\delta$, the latter two groups being described by Haldar et al., in *Science*, Vol. 241, Sep. 1988, pp. 1198 to 1200, for example, Bi$_2$CaSr$_2$Cu$_2$O$_9-\delta$. The most preferred materials are the 1:2:3 ceramic oxides, usually characterized as YBa$_2$Cu$_3$O$_{7-x}$.

The alkaline earth metal-copper oxide based ceramic will be chemically formed from appropriate amounts of constituent oxides and treated by heat or the like to provide appropriate superconducting properties, as is well known in the art. Alkaline earth metals include Mg, Ca, Sr, Ba, and their mixtures.

Figure 1:
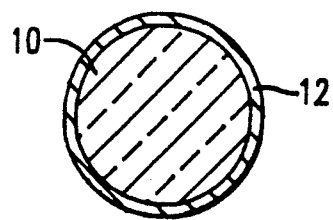
FIG. 1, is a cross-sectional view of one embodiment of the superconductor of this invention, in round wire form, showing a single walled sheath of the composition of this invention, the sheath containing a precompacted plug of submicron superconductor powder.

Referring now to FIG. 1 of the drawings, a core 10, comprising alkaline earth metal-copper oxide based material, having superconducting capability, is enclosed by a single metallic sheath 12. The sheath for example, could have a round outside diameter of 9 mm and a round inside diameter of 7 mm. The sheath 12 will comprise Ag-Pd alloy, containing interdispersed, discrete particles of a metal selected from W, Mo, Ni, or their mixture. Preferably, the particulate additive will constitute from 5 weight % to 45 weight %, most preferably from 10 weight % to 40 weight % of the total alloy-particle weight. Under 5 weight % particulate additive, sheath strength will not be improved to allow superior sheath resistance to deformation during wire and foil fabrication steps. The alloy will preferably contain from 10 weight % to 50 weight %, most preferably from 15 weight % to 40 weight % Pd. The preferred particle size for both the alloy powder and the additive metal powder is from 0.05 micrometer to 75 micrometers, most preferably from 0.05 micrometer to 45 micrometers. Sizes over 75 micrometers, will cause dispersion and pressing problems. The preferred core is YBa$_2$Cu$_3$O$_{7-x}$.

Figure 2:
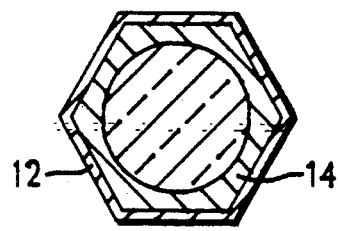
FIG. 2, is a cross-sectional view of one embodiment of the superconductor of this invention showing a two-layer composite sheath, containing a layer of the composition of this invention.
Figure 3:
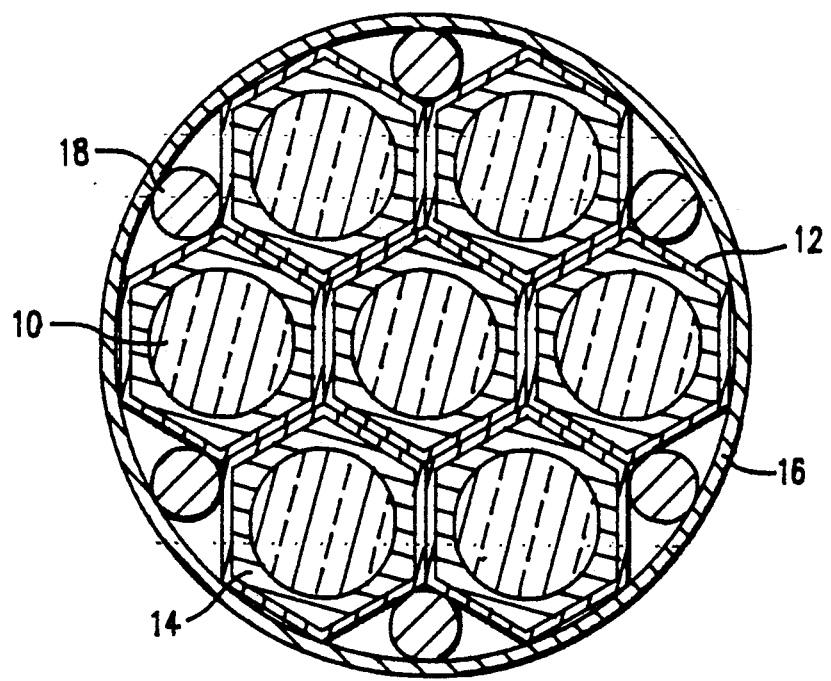
FIG. 3, is a cross-sectional view of bundled hexagonal wire sheathed in the composition of this invention.

FIG. 2 shows a dual sheathed construction, where one of the walls comprises the Ag-Pd sheath 12, containing the interdispersed, discrete, metallic additive particles of this invention. The inner wall 14 can be made of Ag. The dual sheathed wires can be of round, hexagonal, flat foil, or other construction. The layers could also be reversed, with Ag on the outside and layer 12 on the inside. Three or more layered sheaths could also be used, for example, Ag as inner and exterior walls, and the Ag-Pd alloy metal particle wall disposed between them. The hexagonal shape could be achieved during a drawing or rolling process to reduce the diameter of a round, dual sheathed wire. As shown in FIG. 3, a plurality of round or hexagonal wires can be bundled and consolidated within a thin conducting tube 16 of Cu, Ag, or the Ag-Pd sheath of the invention containing interdispersed metallic additive particles. Filler wires 18 of, for example, Ag or Cu can also be used with the bundle, as shown. The consolidation may be performed, for example, by known hot isostatic pressing techniques.

Generally, the core is pressed into a pellet, placed in a sheath, and then processed to wire or ribbon using established wire drawing or extrusion techniques. The wire or ribbon is then given a final oxygen anneal to restore optimum superconducting properties to the core by diffusion of oxygen through the sheath. The use of the Ag-Pd alloy in the sheath, with a fine dispersion of at least one of W, Mo, or Ni particles within the alloy matrix, offers many advantages. Addition of greater than 15 weight % of Pd to the Ag causes the melting point of the resulting alloy to approach 1,040° C., the melting point of the preferred 1:2:3 ceramic oxide core. The melting point of the alloy selected will fall proportionately between that of Ag (960° C.) and Pd (1,552° C.). Use of a Ag-Pd alloy as a sheath material in the processing of high temperature superconductors permits pre or post sintering of the composite at temperatures as close to the core melting point as is desired, thus raising core density, and enhancing interparticle contact for optimum superconducting performance.

Such Ag-Pd alloys will typically have a coefficient of thermal expansion between that of Ag ($19.7 \times 10^6$/°C.) and that of Pd ($11.8 \times 10^{-6}$ /°C.), depending on the weight % Pd used. Use of an Ag-Pd alloy with Pd greater than 15 weight %, the thermal expansion coefficient will approach that of the preferred 1:2:3 ceramic oxide core ($14 \times 10^{-6}$/°C.), so that separation of the alloy sheath from the core will be eliminated or severely reduced during any post fabrication heat treatment, and electrical connectivity problems will disappear.

The incorporation of a discrete distribution of at least one of W, Mo or Ni particles within the matrix, which alloys are readily fabricated by established powder metallurgy techniques, will allow optimization of the sheath material with respect to its melting point, high temperature $O_2$ diffusion characteristics, high strength characteristics, and optimization of thermal expansion coefficients. Use of such dispersions, essential to this invention, will not only result in an alloy with a thermal expansion coefficient compatible with that of the preferred 1:2:3 ceramic oxide core, but will also strengthen the Ag-Pd alloy, thus enhancing the advantages mentioned in the previous paragraphs.

The invention will now be illustrated with reference to the following Example, which is not to be considered in any way limiting.

EXAMPLE

A powder mixture of 65 weight % pre-alloyed Ag-Pd and 35 weight %' W was mixed together. The Ag-Pd component contained 30 weight % Pd. The particle size of both powders was between 0.05 micrometer and 44 micrometers. The mixture was initially cold pressed, and then hot isostatically pressed into pellets at approximately 1,410 kg/cm$^2$ (20,000 psi) for 3 hours at 950° C. These pellets could be easily fabricated a tubular sheath for oxide based superconducting materials.

The coefficient of thermal expansion for the Ag-Pd plus W pellets was measured as $14.24 \times 10^{-6}$, over 25° C. to 1,000° C., which is an excellent match for $YBa_2Cu_3O_{7-x}$ superconducting oxide, which has a coefficient of thermal expansion of $14 \times 10^6$. Metallography indicated that the W remained as discrete particles and was well dispersed throughout the Ag-Pd alloy matrix. Inclusion of Mo or Ni in appropriate amounts should provide similar results. A strip 0.25 cm thick was fabricated from the pellet material and was contacted with $YBa_2Cu_3O_{7-x}$ material at 950° C., with no apparent adverse chemical interactions.

The Ag-Pd alloy, containing intimately dispersed additive W metal particles showed excellent strength characteristics, a high temperature melting point which would allow $O_2$ diffusion, and thermal expansion properties compatible with superconducting materials. The W component also had the ability to incorporate well into the Ag-Pd alloy matrix upon mixing and hot pressing.

We claim:

1. A superconductor having a core comprising alkaline earth metal copper oxide based material having superconductivity capability, enclosed by a contacting metallic sheath, the sheath comprising a layer of Ag-Pd alloy, containing interdispersed, discrete particles of a metal selected from the group consisting of W, Mo, Ni, and mixtures thereof, where the particles have diameters from 0.05 micrometer to 75 micrometers and constitute from 5 weight % to 45 weight % of the total alloy-particle weight.

2. Superconductor of claim 1, where the alloy contains from 10 weight % to 50 weight % Pd and the core is a yttrium-alkaline earth metal-copper oxide.

3. The superconductor of claim 1, also containing a separate sheath layer of Ag, where the core is $YBa_2Cu_3O_{7-31\,x}$ and the alloy sheath contains from 15 weight % to 50 weight % Pd, so that the melting point of the alloy sheath approaches the melting point of the core.

4. The superconductor of claim 1, in round wire form.

5. The superconductor of claim 1, in flat foil form.

6. A plurality of the superconductors of claim 1, bundled together.

7. A superconductor having a core comprising alkaline earth metal-copper oxide based material having superconductivity capability, enclosed by a contacting metallic sheath having at least an inner and outer wall, where one of the walls comprises a Ag-Pd alloy, containing interdispersed, discrete particles of a metal selected from the group consisting of W, Mo, Ni, and mixtures thereof, where the particles have diameters from 0.05 micrometer to 75 micrometers and constitute from 5 weight % to 45 weight % of the total alloy-particle weight, and at least one other wall is made of Ag.

8. The superconductor of claim 7, where the Ag wall contacts the core material as an inner wall.

9. The superconductor of claim 7, where the Ag wall is the outer wall.

10. The superconductor of claim 8, where an additional Ag wall is disposed next to the Ag-Pd alloy-metal particle wall, as the exterior wall of the superconductor.

11. The superconductor of claim 7, where the alloy contains from 10 weight % to 50 weight % Pd and the core is a yttrium-alkaline earth metal-copper oxide.

12. The superconductor of claim 7, in round wire form.

13. The superconductor of claim 7, in flat foil form.

14. A plurality of the superconductors of claim 7, bundled together.

15. The superconductor of claim 7, where the core is $YBa_2Cu_3O_{7-x}$ and the alloy sheath wall contains from 15 weight % to 50 weight % Pd, so that the melting point of the alloy sheath wall approaches the melting point of the core.

* * * * *